(12) United States Patent
Ichikawa

(10) Patent No.: US 9,824,993 B2
(45) Date of Patent: Nov. 21, 2017

(54) PACKAGING STRUCTURE

(71) Applicant: SHINKO ELECTRIC INDUSTRIES CO., LTD., Nagano (JP)

(72) Inventor: Sumihiro Ichikawa, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/202,700

(22) Filed: Jul. 6, 2016

(65) Prior Publication Data

US 2017/0033071 A1     Feb. 2, 2017

(30) Foreign Application Priority Data

Jul. 28, 2015   (JP) .................. 2015-148331

(51) Int. Cl.
*H01L 23/48* (2006.01)
*H01L 23/00* (2006.01)
(Continued)

(52) U.S. Cl.
CPC ............ *H01L 24/17* (2013.01); *H01L 23/295* (2013.01); *H01L 23/3142* (2013.01); *H01L 23/49833* (2013.01); *H01L 25/0657* (2013.01); *H01L 25/50* (2013.01); *H01L 2224/13005* (2013.01); *H01L 2224/13014* (2013.01); *H01L 2224/13109* (2013.01); *H01L 2224/13111* (2013.01); *H01L 2224/13139* (2013.01); *H01L 2224/13147* (2013.01); *H01L 2224/13155* (2013.01);
(Continued)

(58) Field of Classification Search
CPC . H01L 24/17; H01L 25/0657; H01L 23/3142; H01L 23/295; H01L 23/49833; H01L 25/50
See application file for complete search history.

(56) References Cited

U.S. PATENT DOCUMENTS 6,768,209 B1 * 7/2004 Jiang .................... H01L 21/563
                                                                    257/737
8,912,044 B2   12/2014  Hu et al.
(Continued)

FOREIGN PATENT DOCUMENTS

JP    H08-046313    2/1996
JP    2000-232200   8/2000
(Continued)

*Primary Examiner* — Syed Gheyas
(74) *Attorney, Agent, or Firm* — IPUSA, PLLC

(57) ABSTRACT

A packaging structure includes a first substrate including a first metal terminal and a first protruding resin portion formed at a first surface; a second substrate including a second metal terminal and a second protruding resin portion formed at a second surface, the second metal terminal being made of the same kind of metal as the first metal terminal; and a sealing portion filled between the first surface of the first substrate and the second surface of the second substrate, the first metal terminal and the second metal terminal being directly bonded with each other, the first protruding resin portion and the second protruding resin portion being directly bonded with each other, each of the first protruding resin portion and the second protruding resin portion being made of a resin material that does not include fillers, and the sealing portion being made of a resin material including fillers.

4 Claims, 3 Drawing Sheets

(51) Int. Cl.
  *H01L 25/065* (2006.01)
  *H01L 23/31* (2006.01)
  *H01L 23/29* (2006.01)
  *H01L 23/498* (2006.01)
  *H01L 25/00* (2006.01)

(52) U.S. Cl.
  CPC ............. *H01L 2224/16148* (2013.01); *H01L 2224/16238* (2013.01); *H01L 2224/81193* (2013.01); *H01L 2225/06513* (2013.01); *H01L 2225/06593* (2013.01); *H01L 2924/14* (2013.01)

(56) References Cited

U.S. PATENT DOCUMENTS

| | | | |
|---|---|---|---|
| 9,478,520 B2 * | 10/2016 | Tsukimura | H01L 31/02016 |
| 2002/0056899 A1 | 5/2002 | Hikita et al. | |
| 2005/0212114 A1 * | 9/2005 | Kawano | H01L 24/83 257/690 |
| 2009/0127705 A1 * | 5/2009 | Miyata | H01L 22/34 257/737 |
| 2012/0171818 A1 * | 7/2012 | Barth | H01L 21/76898 438/107 |

FOREIGN PATENT DOCUMENTS

| | | | |
|---|---|---|---|
| JP | 2001-291803 | 10/2001 | |
| JP | 2014-120768 | 6/2014 | |
| JP | 2015-008228 | 1/2015 | |
| WO | WO 2008144171 A1 * | 11/2008 | B32B 27/30 |

\* cited by examiner

PACKAGING STRUCTURE

CROSS-REFERENCE TO RELATED APPLICATIONS

The present application is based on and claims the benefit of priority of Japanese Priority Application No. 2015-148331 filed on Jul. 28, 2015, the entire contents of which are hereby incorporated by reference.

FIELD

The present invention relates to a packaging structure.

BACKGROUND

A packaging structure is known in which a first substrate including a copper terminal and a second substrate including a copper terminal are stacked, and in which the copper terminals are directly bonded (so-called a Cu—Cu direct bonding).

For Cu—Cu direct bonding, a method in which surfaces of the copper terminals to be bonded are activated and in which the surfaces of the copper terminals are bonded under vacuum pressure (room temperature bonding, SAB: Surface Activated Bonding), a method in which the surfaces of the copper terminals are grinded by a tool grinder or the like and in which the copper terminals are bonded under reducing atmosphere at vacuum pressure, a bonding method by generating metal salt or the like, is used.

Here, before performing the Cu—Cu direct bonding, it is necessary to align the copper terminals to be bonded. For a method of aligning the copper terminals before bonding, a first method is known that uses an apparatus including an alignment device provided in a vacuum chamber, for example.

Further, a second method that is called hybrid bonding is known. According to this method, a copper terminal formed on a first substrate is sealed by semi-cured resin, and a front end side of the copper terminal and a surface of the resin are grinded or polished so that the heights of the copper terminal and the resin become equal. Similarly, a copper terminal formed on a second substrate is sealed by semi-cured resin, and a front end side of the copper terminal and a surface of the resin are grinded or polished so that the heights of the copper terminal and the resin become equal. Then, the second substrate is provided on the first substrate such that the front end sides of the copper terminals face with each other, and the first substrate and the second substrate are temporarily fixed by contacting surfaces of the semi-cured resins. Thereafter, the copper terminals are directly bonded (Cu—Cu directly bonded) by thermal compression bonding and the semi-cured resins are completely cured.

Patent Document 1: Japanese Laid-open Patent Publication No. 2015-008228

However, by the above described first method, the apparatus that includes the alignment device in the vacuum chamber is expensive, and corrosion of the alignment device may occur as well.

Further, by the second method, there may be a problem that the resin may be inserted between the copper terminals when temporarily fixing the copper terminals or directly bonding the copper terminals, and the connection reliability between the copper terminals is lowered.

SUMMARY

The present invention is made in light of the above problems, and provides a packaging structure obtained by directly bonding metal terminals without using an apparatus including an alignment device in a vacuum chamber with high connection reliability.

According to an embodiment, there is provided a packaging structure including a first substrate including a first metal terminal and a first protruding resin portion formed at a first surface of the first substrate; a second substrate including a second metal terminal and a second protruding resin portion formed at a second surface of the second substrate, the second metal terminal being made of the same kind of metal as the first metal terminal, the second substrate being provided on the first substrate such that the second surface of the second substrate faces the first surface of the first substrate; and a sealing portion filled between the first surface of the first substrate and the second surface of the second substrate, the first metal terminal and the second metal terminal being directly bonded with each other, the first protruding resin portion and the second protruding resin portion being directly bonded with each other, each of the first protruding resin portion and the second protruding resin portion being made of a resin material that does not include fillers, and the sealing portion being made of a resin material including fillers.

BRIEF DESCRIPTION OF DRAWINGS

Other objects, features and advantages of the present invention will become more apparent from the following detailed description when read in conjunction with the accompanying drawings.

DESCRIPTION OF EMBODIMENTS

Figure 1A:
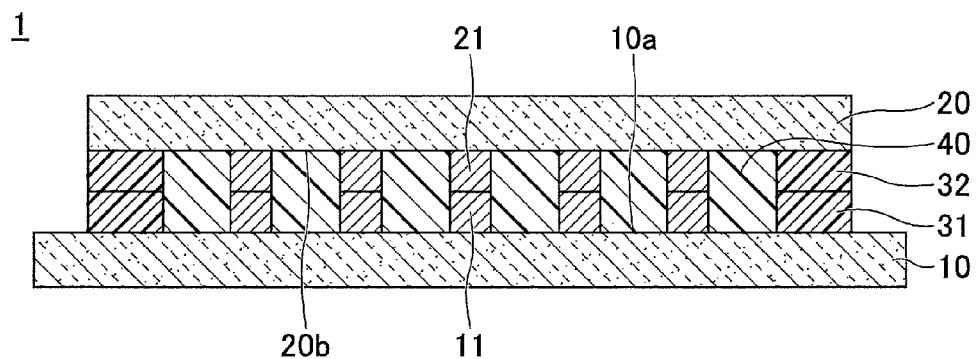
FIG. 1A and FIG. 1B are views illustrating an example of a packaging structure of an embodiment.

The invention will be described herein with reference to illustrative embodiments. It is to be noted that, in the explanation of the drawings, the same components are given the same reference numerals, and explanations are not repeated.

(Structure of Packaging Structure of Embodiment)

Figure 1B:
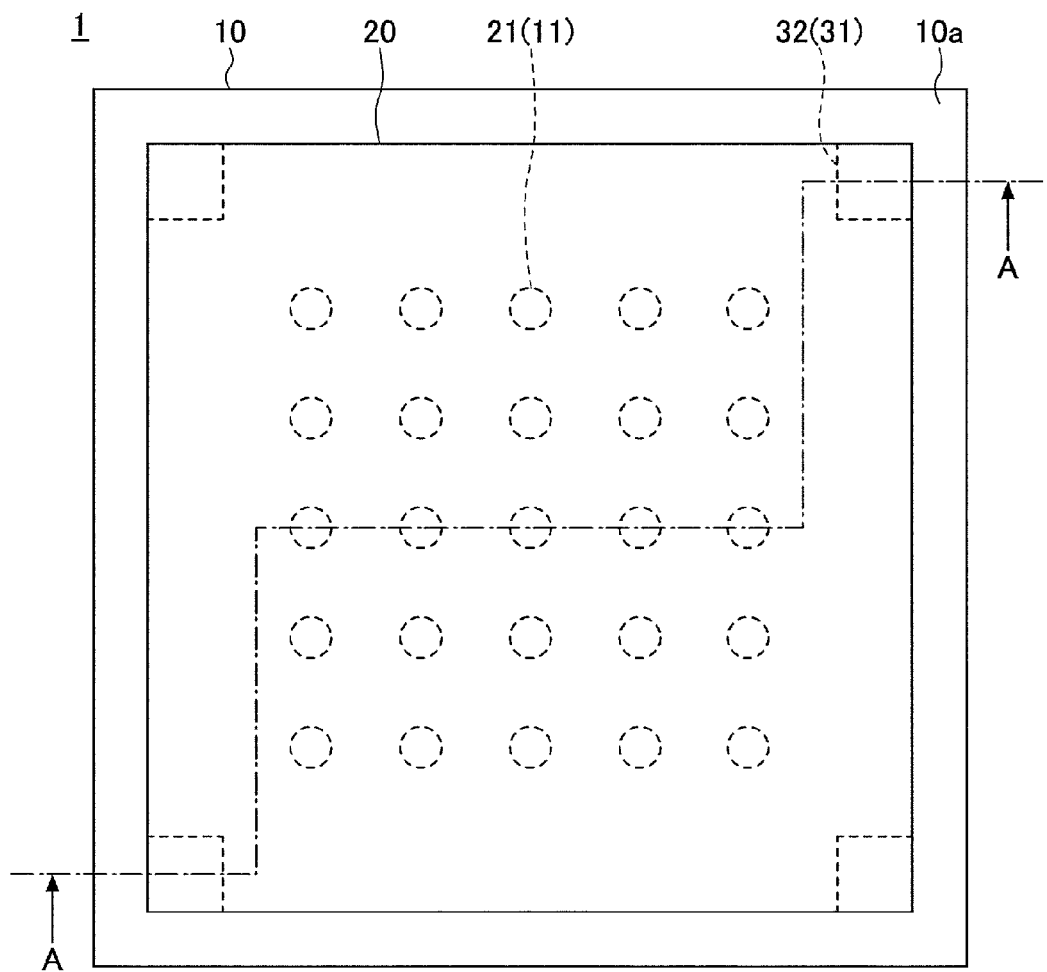

First, a structure of a packaging structure of the embodiment is described. FIG. 1A and FIG. 1B are views illustrating an example of a packaging structure 1 of the embodiment. FIG. 1B is a plan view and FIG. 1A is a cross-sectional view taken along an A-A line of FIG. 1B.

With reference to FIG. 1A and FIG. 1B, the packaging structure 1 includes a first substrate 10, a second substrate 20 and a sealing portion 40. In the packaging structure 1, the second substrate 20 is stacked on the first substrate 10 such that another surface 20b (second surface) of the second substrate 20 faces one surface 10a (first surface) of the first substrate 10.

In this embodiment, a second substrate 20 side of the packaging structure 1 is referred to as an upper side or one side, and a first substrate 10 side of the packaging structure 1 is referred to as a lower side or the other side. Further, a surface of each component at the second substrate 20 side is referred to as one surface or an upper surface, and a surface at the first substrate 10 side is referred to as the other surface or a lower surface. However, the packaging structure 1 may be used in an opposite direction or may be used at an arbitrary angle. Further, in this embodiment, "in a plan view" means that an object is seen in a direction that is normal to the one surface 10a of the first substrate 10, and a "plan shape" means a shape of an object seen in the direction that is normal to the one surface 10a of the first substrate 10.

The first substrate 10 is a so-called glass epoxy substrate or the like in which insulating resin such as epoxy-based resin or the like is impregnated in a glass cloth, for example. For the first substrate 10, a resin substrate in which insulating resin such as epoxy-based resin or the like is impregnated in a woven fabric or a nonwoven fabric such as glass fiber, carbon fiber, aramid fiber or the like may be used. Further, for the first substrate 10, a silicon substrate may be used, or a ceramic substrate may be used. Further, when the first substrate 10 is the silicon substrate, a semiconductor integrated circuit may be formed in the first substrate 10. The thickness of the first substrate 10 may be about a few dozen $\mu m$ to a few mm, for example.

The material and the thickness of the second substrate 20 may be the same as those of the first substrate 10, for example. Here, the first substrate 10 and the second substrate 20 may be the same kind, or may be different kinds. For example, both of the first substrate 10 and the second substrate 20 may be resin substrates, respectively, or the first substrate 10 may be a resin substrate while the second substrate 20 may be a silicon substrate.

In other words, the packaging structure 1 may be a stacked structure of wiring substrates in which none of the first substrate 10 and the second substrate 20 includes a semiconductor integrated circuit. Alternatively, the packaging structure 1 may be a stacked structure of a semiconductor chip or a semiconductor wafer that includes a semiconductor integrated circuit and a wiring substrate that does not include a semiconductor integrated circuit. In this case, one of the first substrate 10 and the second substrate 20 may be the semiconductor chip or the semiconductor wafer, and the other of the first substrate 10 and the second substrate 20 is the wiring substrate. Alternatively, the packaging structure 1 may be a stacked structure of semiconductor chips, a stacked structure of a semiconductor chip and a semiconductor wafer or a stacked structure of semiconductor wafers. In this case, each of the first substrate 10 and the second substrate 20 includes a semiconductor integrated circuit. Alternatively, the packaging structure 1 may include a plurality of one of the first substrates 10 and the second substrates 20 and a single of the other of the first substrate 10 and the second substrate 20.

A plurality of first metal terminals 11 are formed at the one surface 10a of the first substrate 10. A plurality of second metal terminals 21 are formed at the other surface 20b of the second substrate 20. In this embodiment, the plurality of the first metal terminals 11 and the second metal terminals 21 are provided as an area array (in a grid form) on the first substrate 10 and the second substrate 20, respectively. The first metal terminals 11 and the second metal terminals 21 face with each other, respectively. The first metal terminal 11 and the second metal terminal 21 that are facing with each other are made of the same kind of metal, and are directly bonded.

For the material of the first metal terminal 11 and the second metal terminal 21, copper (Cu) may be used, for example. In such a case, the first metal terminal 11 and the second metal terminal 21 are bonded by a so-called Cu—Cu direct bonding. Here, the material of the first metal terminal 11 and the second metal terminal 21 may be the same kind of metal other than copper (Cu) as long as the first metal terminal 11 and the third metal terminal 21 can be directly bonded. Other than copper (Cu), nickel (Ni), silver (Ag), indium (In), tin (Sn) or the like may be used, for example.

The first metal terminal 11 and the second metal terminal 21 may have a cylindrical shape, for example. The height of the first metal terminal 11 and the second metal terminal 21 may be about 5 $\mu m$ to 500 $\mu m$, for example. When the first metal terminal 11 and the second metal terminal 21 have a cylindrical shape, respectively, the diameter of an end surface of the cylindrical may be about 5 $\mu m$ to a few hundred $\mu m$, for example. The pitch of the first metal terminals 11 and the second metal terminals 21 may be about 20 $\mu m$ to a few hundred $\mu m$, respectively, for example.

A plurality of first protruding resin portions 31 are provided at an area that is a further outer periphery side of an area at which the first metal terminals 11 are provided on the one surface 10a of the first substrate 10. Similarly, a plurality of second protruding resin portions 32 are provided at an area that is a further outer periphery side of an area at which the second metal terminals 21 are provided on the other surface 20b of the second substrate 20. The first protruding resin portions 31 and the second protruding resin portions 32 face with each other, and are directly connected, respectively.

For the material of the first protruding resin portions 31 and the second protruding resin portions 32, insulating resin such as thermosetting epoxy-based resin or the like may be used, for example. The first protruding resin portions 31 and the second protruding resin portions 32 do not include fillers. The first substrate 10 and the second substrate 20 are rectangular in FIG. 1B, respectively, and the first protruding resin portions 31 and the second protruding resin portions 32 are provided at four corners of the first substrate 10 and the second substrate 20, respectively. Here, the packaging structure 1 may include at least two of the first protruding resin portions 31 and two of the second protruding resin portions 32. The number of each of the first protruding resin portions 31 and the second protruding resin portions 32 may be three, or five or more. Furthermore, each of the first protruding resin portions 31 and the second protruding resin portions 32 may be formed into an elongated shape.

Here, when the first substrate 10 and the second substrate 20 are rectangular, it is preferable that all of or a part of the first protruding resin portions 31 and the second protruding resin portions 32 are provided on a diagonal line of the rectangular, respectively. This is because, as will be described later, the first protruding resin portions 31 and the second protruding resin portions 32 are used for temporarily fixing the first substrate 10 and the second substrate 20, and it is necessary to place the first protruding resin portions 31 and the second protruding resin portions 32 with good balance.

The sealing portion 40 is formed between the one surface 10a of the first substrate 10 and the other surface 20b of the second substrate 20 so as to cover the first metal terminals 11 and the second metal terminals 21. The sealing portion 40 is so-called underfill resin, and may be insulating resin such as thermosetting epoxy-based resin or the like, for example. The sealing portion 40 includes fillers such as silica ($SiO_2$) or the like. By including the fillers, the entire strength of the packaging structure 1 can be improved.

(Method of Manufacturing Packaging Structure of Embodiment)

Next, a method of manufacturing the packaging structure 1 of the embodiment is described. FIG. 2A to FIG. 3C are views illustrating an example of manufacturing steps of the packaging structure 1 of the embodiment. Here, FIG. 2A to FIG. 3C illustrate cross-sections corresponding to the cross-section of FIG. 1A, respectively.

Figure 2A:
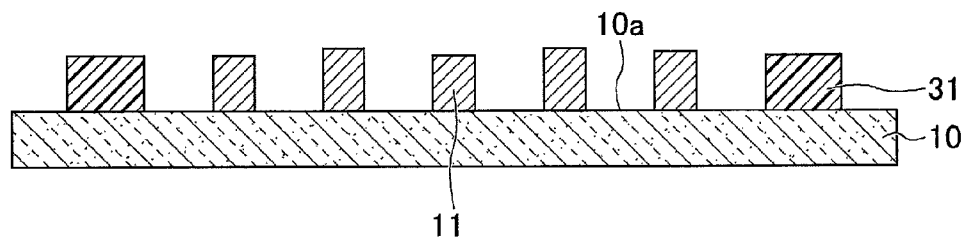
FIG. 2A to FIG. 2O are views illustrating an example of manufacturing steps of the packaging structure of the embodiment.
Figure 2B:
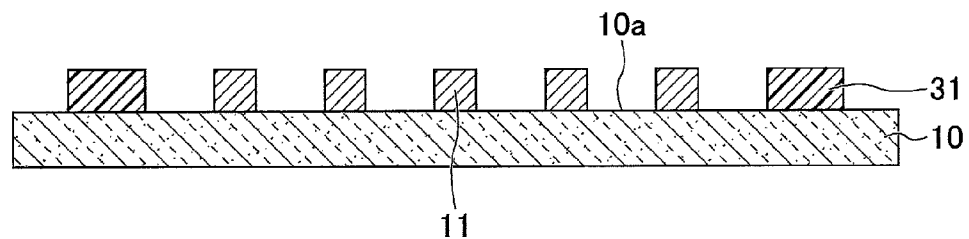

First, in a step illustrated in FIG. 2A, the first substrate 10 such as a resin substrate, a silicon substrate or the like is prepared and the first metal terminals 11 are formed at the one surface 10a of the first substrate 10. For the material of the first metal terminals 11, copper (Cu) may be used, for example. The first metal terminals 11 may be formed by a semi-additive process, for example. Here, in this step, there is a case that the heights of the first metal terminals 11 are not the same.

Next, the plurality of first protruding resin portions 31 at B-stage (semi-cured) are formed at an area that is a further outer periphery side of an area at which the first metal terminals 11 are provided, at the one surface 10a of the first substrate 10. The first protruding resin portions 31 may be provided at four positions, respectively, as illustrated in FIG. 1B, for example. For the material of the first protruding resin portion 31, insulating resin such as thermosetting epoxy-based resin or the like may be used, for example. The first protruding resin portions 31 do not include fillers. The first protruding resin portions 31 may be formed by laminating B-stage (semi-cured) resin films, for example. Alternatively, the first protruding resin portions 31 may be formed by coating liquid or paste resin by printing or the like, and pre-baking it to be B-stage resin.

Next, in a step illustrated in FIG. 23, front end sides of the first metal terminals 11 and the first protruding resin portions 31 are grinded by a tool grinder, for example, to make the heights of the first metal terminals 11 and the first protruding resin portions 31 equal, and also planarizing and activating the upper end surfaces of the first metal terminals 11. At this time, as the first protruding resin portions 31 do not include fillers that cause nicking of a blade of the tool grinder, the first protruding resin portions 31 can be easily grinded by the tool grinder with the first metal terminals 11.

Figure 2C:
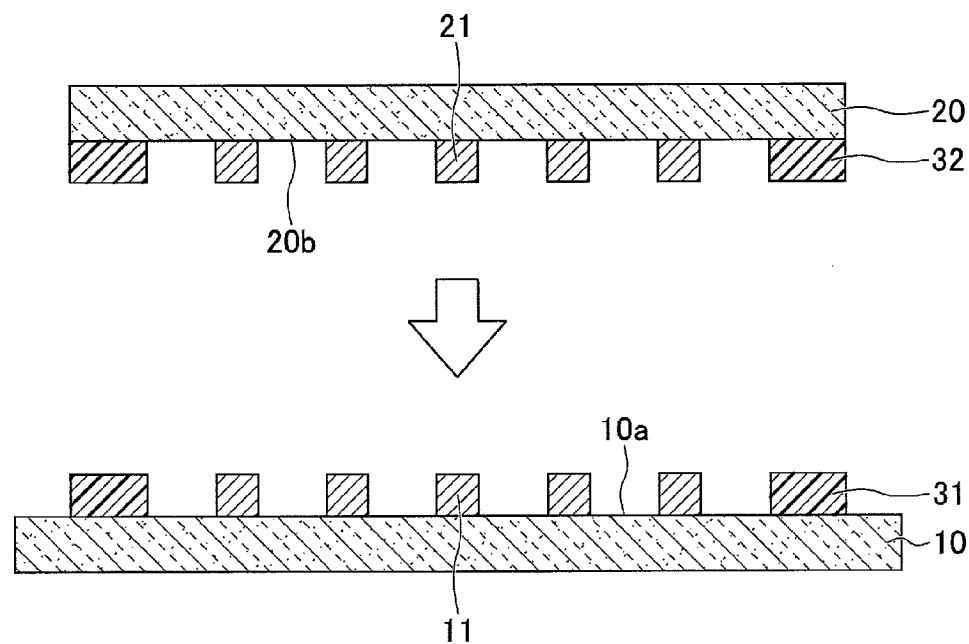

Next, in a step illustrated in FIG. 2C, first, similar to the step of FIG. 2A, the second metal terminals 21 and the second protruding resin portions 32 are formed at the other surface 20b of the second substrate 20. The same kind of metal as the first metal terminals 11 may be used for the second metal terminals 21, for example. For example, when the first metal terminals 11 are made of copper (Cu), the second metal terminals 21 are also made of copper (Cu). Further, the same kind of resin, that does not include fillers, as the first protruding resin portions 31 may be used for the second protruding resin portions 32, for example.

Then, by the step similar to FIG. 23, front end sides of the second metal terminals 21 and the second protruding resin portions 32 are grinded by a tool grinder, for example, to make the heights of the second metal terminals 21 and the second protruding resin portions 32 equal, and also planarizing and activating the lower end surfaces of the second metal terminals 21. At this time, as the second protruding resin portions 32 do not include fillers that cause nicking of a blade of the tool grinder, the second protruding resin portions 32 can be easily grinded by the tool grinder with the second metal terminals 21. Thereafter, the second substrate 20 is aligned on the first substrate 10 such that the upper end surfaces of the first metal terminals 11 face with the lower end surfaces of the second metal terminals 21, and the upper end surfaces of the first protruding resin portions 31 face with the lower end surfaces of the second protruding resin portions 32, respectively.

Figure 3A:
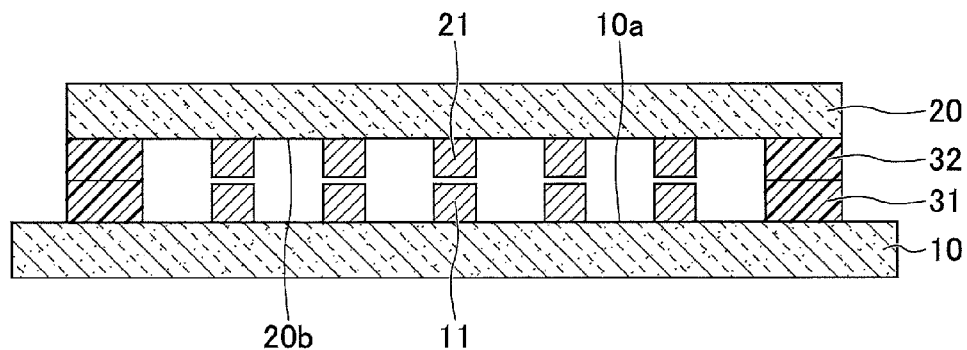
FIG. 3A to FIG. 3C are views illustrating an example of manufacturing steps of the packaging structure of the embodiment.

Next, in a step illustrated in FIG. 3A, the second substrate 20 is stacked on the first substrate 10 such that the upper end surfaces of the first protruding resin portions 31 contact the lower end surfaces of the second protruding resin portions 32, respectively. As the first protruding resin portions 31 and the second protruding resin portions 32 are at B-stage, the second substrate 20 is temporarily fixed on the first substrate 10. When temporarily fixing, the first protruding resin portions 31 and the second protruding resin portions 32 may be heated to an extent that the first protruding resin portions 31 and the second protruding resin portions 32 are not cured yet (at temperature about less than or equal to 100° C., for example). Further, at this time, there may be a case that a slight space is formed between the upper end surface of the first metal terminal 11 and the lower end surface of the respective second metal terminal 21. Further, there may be a case that an oxide film is formed at the upper end surface of the first metal terminal 11 and at the lower end surface of the second metal terminal 21.

Figure 3B:
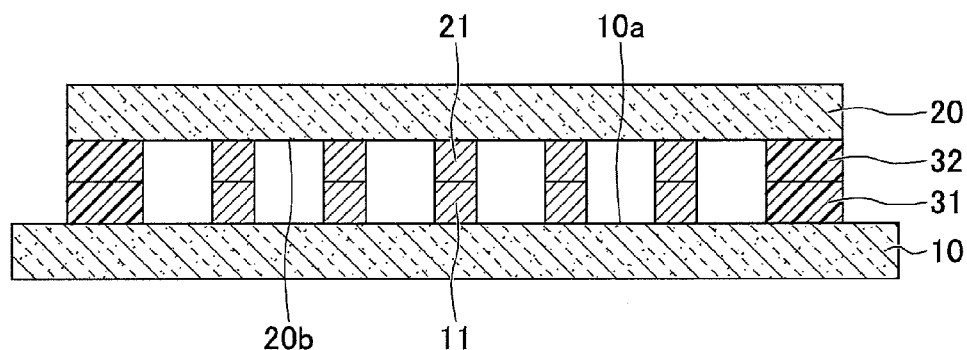
Figure 3C:
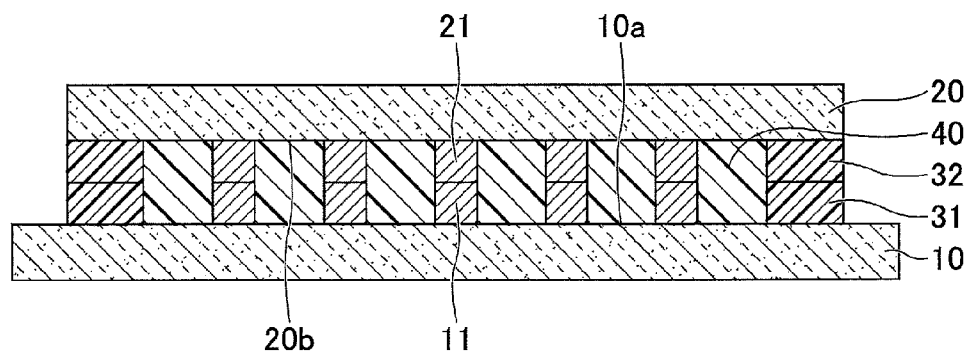

Next, in a step illustrated in FIG. 3B, in reducing atmosphere such as formic acid atmosphere, hydrogen radical atmosphere or the like, the second substrate 20 is pushed toward the first substrate 10 while heating the first protruding resin portions 31 and the second protruding resin portions 32 at temperature greater than or equal to curing temperatures (at temperature about 150 to 300° C., for example) of the resins that compose the first protruding resin portions 31 and the second protruding resin portions 32, respectively.

With this, the oxide film formed at the upper end surface of the first metal terminal 11 and the lower end surface of the second metal terminal 21 is removed by the reducing material such as formic acid or the like, and the upper end surfaces of the first metal terminals 11 and the lower end surfaces of the second metal terminals 21 are directly bonded, respectively, by thermal compression bonding. When the materials of the first metal terminals 11 and the second metal terminals 21 are copper (Cu), these are bonded by so-called Cu—Cu direct bonding. Here, if a slight space is formed between the upper end surface of the first metal terminal 11 and the lower end surface of the second metal terminal 21, the reducing material such as formic acid or the like enters from the space to remove the oxide film. Thereafter, the first protruding resin portions 31 and the second protruding resin portions 32 are cured and are directly bonded.

Here, the period necessary for curing the first protruding resin portions 31 and the second protruding resin portions 32 is sufficiently long compared with the period necessary for directly bonding the upper end surfaces of the first metal terminals 11 and the lower end surfaces of the second metal terminal 21. Thus, direct bonding between the first metal terminals 11 and the respective second metal terminals 21 is completed first, and thereafter, curing of the first protruding resin portions 31 and the second protruding resin portions 32 is started. Then, after a certain period, the first protruding resin portions 31 and the second protruding resin portions 32 are completely cured.

However, this is just an example, and the curing period of the first protruding resin portions 31 and the second protruding resin portions 32 depend on the curing temperatures of the resins that compose the first protruding resin portions 31 and the second protruding resin portions 32. For example, when resin whose curing temperature is low is used, curing may start prior to direct bonding between the first metal terminals 11 and the respective second metal terminals 21, or curing may start at the same time with the direct bonding.

Next, in a step illustrated in FIG. 30, insulating resin such as thermosetting epoxy-based resin or the like is filled between the one surface 10a of the first substrate 10 and the other surface 20b of the second substrate 20 and cured to form the sealing portion 40. With this, the packaging structure 1 is completed. The sealing portion 40 includes fillers such as silica ($SiO_2$) or the like.

As such, according to the embodiment, the first protruding resin portions 31 and the second protruding resin portions 32 are provided at an area at which the first metal terminals 11 and the second metal terminals 21 are not provided. Then, the first metal terminals 11 and the second metal terminals 21 facing with each other are aligned by temporarily fixing the first protruding resin portions 31 and the second protruding resin portions 32 facing with each other, respectively. Here, as there is no resin at the area at which the first metal terminals 11 and the second metal terminals 21 are provided, resin is not inserted between the first metal terminal 11 and the respective second metal terminal 21 in alignment. As a result, the first metal terminals 11 and the second metal terminals 21 can be directly bonded with high reliability.

Further, as the first metal terminals 11 and the second metal terminals 21 facing with each other, respectively, are aligned by temporarily fixing the first protruding resin portions 31 and the second protruding resin portions 32, it is unnecessary to use an expensive apparatus that includes an alignment device. Here, an apparatus that heats the first protruding resin portions 31 and the second protruding resin portions 32 under reducing atmosphere such as formic acid atmosphere, hydrogen radical atmosphere or the like, which does not include an alignment device, does not include an alignment device and is inexpensive.

Further, as the resin material that does not include fillers is used for the material of the first protruding resin portion 31, the first protruding resin portion 31 can be easily grinded by a tool grinder with the first metal terminal 11 without causing nicking of a blade of the tool grinder. Thus, it is easy to make the heights of the first protruding resin portion 31 and the first metal terminal 11 equal. This is the same for the second protruding resin portion 32 and the second metal terminal 21.

Further, the step of temporarily fixing the first protruding resin portions 31 and the second protruding resin portion 32 is performed before the step of directly bonding the first metal terminals 11 and the second metal terminal 21, respectively. With this, even when bonding a plurality of individualized semiconductor chips on a semiconductor wafer, for example, by temporarily fixing the individualized semiconductor chips with the semiconductor wafer at an appropriate position, the semiconductor chips and the semiconductor wafer can be proceeded to the bonding step without causing a positional shift.

According to the embodiment, a packaging structure obtained by directly bonding metal terminals without using an apparatus including an alignment device in a vacuum chamber with high connection reliability can be provided.

Although a preferred embodiment of the packaging structure has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

Various aspects of the subject-matter described herein are set out non-exhaustively in the following numbered clauses:

1. A method of manufacturing a packaging structure including:
preparing a first substrate including a first metal terminal and a semi-cured first protruding resin portion formed at a first surface of the first substrate,
preparing a second substrate including a second metal terminal and a semi-cured second protruding resin portion formed at a second surface of the second substrate, the second metal terminal being made of the same kind of metal as the first metal terminal;
stacking the second substrate on the first substrate such that an end surface of the first metal terminal faces an end surface of the second metal terminal and an end surface of the first protruding resin portion faces an end surface of the second protruding resin portion, and temporarily fixing the end surface of the first protruding resin portion and the end surface of the second protruding resin portion;
heating the first protruding resin portion and the second protruding resin portion at temperature that is greater than or equal to curing temperatures of resins composing the first protruding resin portion and the second protruding resin portion, respectively, removing an oxide film at the end surface of the first metal terminal and the end surface of the second metal terminal, pressing the second substrate toward the first substrate and directly bonding the end surface of the first metal terminal and the end surface of the second metal terminal; and
directly bonding the first protruding resin portion and the second protruding resin portion by curing the first protruding resin portion and the second protruding resin portion while directly bonding the end surface of the first metal terminal and the end surface of the second metal terminal.

2. The method of manufacturing the packaging structure according to clause 1, wherein the directly bonding is performed under reducing atmosphere.

3. The method of manufacturing the packaging structure according to clause 1 or 2, further including activating the end surface of the first metal terminal and the end surface of the second metal terminal by grinding prior to the temporarily fixing.

4. The method of manufacturing the packaging structure according to clause 3, wherein in the activating, the end surface of the first metal terminal and the end surface of the first protruding resin portion are grinded to make heights of the first metal terminal and the first protruding resin portion equal, and the end surface of the second metal terminal and the end surface of the second protruding resin portion are grinded to make heights of the second metal terminal and the second protruding resin portion equal.

What is claimed is:
1. A packaging structure comprising:
a first substrate including a first metal terminal and a first protruding resin portion formed at a first surface of the first substrate,
heights of the first metal terminal and the first protruding resin portion being the same;
a second substrate including a second metal terminal and a second protruding resin portion formed at a second surface of the second substrate, the second metal terminal being made of the same kind of metal as the first metal terminal,
heights of the second metal terminal and the second protruding resin portion being the same,
the second substrate being provided on the first substrate such that the second surface of the second substrate faces the first surface of the first substrate; and a sealing portion filled between the first surface of the first substrate and the second surface of the second substrate, the first metal terminal and the second metal terminal being directly bonded with each other, the first protruding resin portion and the second protruding resin portion being directly bonded with each other, each of the first protruding resin portion and the second protruding resin portion being made of a resin material that does not include fillers, and the sealing portion being made of a resin material including fillers.

2. The packaging structure according to claim 1, further comprising a plurality of the first protruding resin portions and a plurality of the second protruding resin portions, wherein the plurality of first protruding resin portions and the plurality of second protruding resin portions are provided at an area that is an outer periphery side of an area at which the first metal terminal and the second metal terminal are provided, in a plan view.

3. The packaging structure according to claim 2, wherein each of the first substrate and the second substrate is rectangular, in a plan view, and wherein all of or a part of the first protruding resin portions and all of or a part of the second protruding resin portions are placed on a diagonal line of the rectangular of the first substrate and the second substrate, respectively, in a plan view.

4. The packaging structure according to claim 2, wherein the heights of the first metal terminal and the plurality of first protruding resin portions are the same, and wherein the heights of the second metal terminal and the plurality of second protruding resin portions are the same.

* * * * *